United States Patent
Satou et al.

(10) Patent No.: US 12,165,702 B2
(45) Date of Patent: Dec. 10, 2024

(54) SEMICONDUCTOR DEVICE

(71) Applicant: RENESAS ELECTRONICS CORPORATION, Tokyo (JP)

(72) Inventors: Kouji Satou, Tokyo (JP); Shunya Nagata, Tokyo (JP); Jiro Ishikawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 196 days.

(21) Appl. No.: 17/879,524

(22) Filed: Aug. 2, 2022

(65) Prior Publication Data

US 2023/0088709 A1 Mar. 23, 2023

(30) Foreign Application Priority Data

Sep. 21, 2021 (JP) .................. 2021-153670

(51) Int. Cl.
| | |
|---|---|
| *G11C 11/419* | (2006.01) |
| *G11C 11/412* | (2006.01) |
| *H10B 10/00* | (2023.01) |
| *G11C 11/41* | (2006.01) |

(52) U.S. Cl.
CPC .......... *G11C 11/419* (2013.01); *G11C 11/412* (2013.01); *H10B 10/12* (2023.02); *H10B 10/18* (2023.02)

(58) Field of Classification Search
CPC ..... G11C 11/419; G11C 11/412; H10B 10/12; H10B 10/18
See application file for complete search history.

(56) References Cited

U.S. PATENT DOCUMENTS

| | | | |
|---|---|---|---|
| 4,831,595 A * | 5/1989 | Bone .................. | G11C 5/141 365/229 |
| 6,657,911 B2 | 12/2003 | Yamaoka et al. | |
| 7,200,030 B2 | 4/2007 | Yamaoka et al. | |
| 8,811,057 B1 * | 8/2014 | Madan .............. | G11C 11/2297 365/229 |
| 2021/0191435 A1 * | 6/2021 | Arora ................ | G05B 19/042 |
| 2021/0358558 A1 * | 11/2021 | Lee ................... | G11C 5/147 |

FOREIGN PATENT DOCUMENTS

| | | |
|---|---|---|
| JP | 2003-132683 A | 5/2003 |
| JP | 2004-206745 A | 7/2004 |

* cited by examiner

*Primary Examiner* — Han Yang
(74) *Attorney, Agent, or Firm* — Rimon P.C.

(57) ABSTRACT

A semiconductor device includes a first regulator for generating a first power supply potential, a second regulator for generating a second power supply potential lower than the first power supply potential, and a static random access memory (SRAM) having a normal operation mode and a resume standby mode. The SRAM includes power supply switching circuits receiving a first power supply potential and a second power supply potential, and a memory array including a plurality of memory cells. When the SRAM is in the normal operation mode, the power switch circuit is controlled so that the first power supply potential is supplied from the power switch circuit to the memory array, and when SRAM is in the resume standby mode, the second power supply potential is supplied from the power switch circuit to the memory array.

6 Claims, 19 Drawing Sheets

SEMICONDUCTOR DEVICE

CROSS-REFERENCE TO RELATED APPLICATIONS

The disclosure of Japanese Patent Application. No. 2021-153670 filed on Sep. 21, 2021, including the specification, drawings and abstract is incorporated herein by reference in its entirety.

BACKGROUND

The present disclosure relates to a semiconductor device, and more particularly, the present disclosure is a technique useful for a semiconductor device having a storage device such as a static random access memory (SRAM).

As proposals for reducing leakage current in a static random access memory (SRAM) incorporated in a semiconductor device, for example, there are disclosed techniques listed below.

[Patent Document 1] Japanese Patent Application Publication No. 2004-206745
[Patent Document 2] Japanese Patent Application Publication No. 2003-132683

SUMMARY

If the power supply potential of the memory cell is lowered to reduce the leakage current, the write characteristics and read characteristics may deteriorate. In addition, when the potential state of the power supply potential or the ground potential of the memory cell is determined by transistor characteristics such as the threshold voltage (Vt) of the MOS transistor, the leakage current may not be sufficiently reduced.

An object of the present disclosure is to provide a static random access memory (SRAM) incorporated in a semiconductor device, which can reduce a leakage current while maintaining a write characteristic and a read characteristic in a normal operation of the semiconductor device.

Other objects and novel features will become apparent from the description of this specification and the accompanying drawings.

An outline of representative ones of the present disclosure will be briefly described below.

According to one embodiment, a semiconductor device includes a first regulator for generating a first power supply potential, a second regulator for generating a second power supply potential lower than the first power supply potential, and a static random access memory (SRAM) having a normal operation mode and a resume standby mode. The SRAM includes power supply switching circuits receiving a first power supply potential and a second power supply potential, and a memory array including a plurality of memory cells. When the SRAM is in the normal operation mode, the power switch circuit is controlled so that the first power supply potential is supplied from the power switch circuit to the memory array, and when the SRAM is in the resume standby mode, the second power supply potential is supplied from the power switch circuit to the memory array.

According to the semiconductor device according to the above embodiment, while maintaining the write characteristics and read characteristics in the normal operation, it is possible to reduce the leakage current.

DETAILED DESCRIPTION

Figure 1:
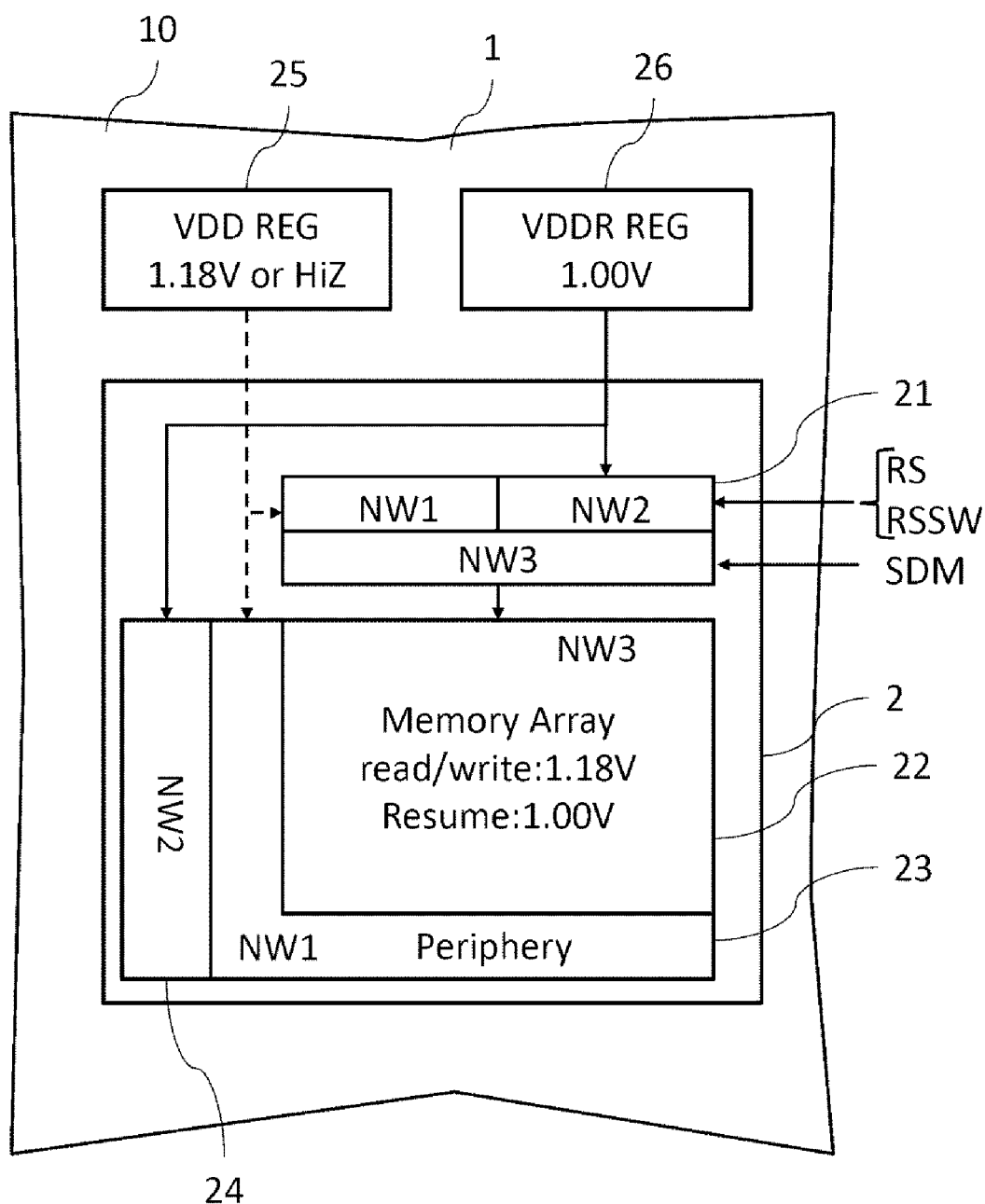
FIG. 1 is a block diagram illustrating a configuration example of a semiconductor device according to a first embodiment.

Hereinafter, embodiments will be described with reference to the drawings. However, in the following description, the same components are denoted by the same reference numerals, and a repetitive description thereof may be omitted. It should be noted that the drawings may be represented schematically in comparison with actual embodiments for the sake of clarity of explanation, but are merely an example and do not limit the interpretation of the present invention.

Prior to the description of the embodiments, problems will be described in order to facilitate understanding of the present disclosure.

In Patent Document 1, a power source dd is connected to VDD of a memory cell, and a source line ss1 is connected to a source of a driving MOS of the memory cell. In order to further reduce the leakage current in the configuration of Patent Document 1, it is necessary to lower the power supply dd. However, when the power supply dd is lowered, there are the following problems. 1) If the memory cell power supply is lowered to reduce leakage, Write/Read characteristics are deteriorated. 2) The output voltage of the regulator cannot be changed dynamically in the real-time OS. 3) It is difficult to control the power supply of each memory.

In Patent Document 2, to reduce the leakage current by changing the power supplied to SRAM at the time of ResumeStandby. The configuration of Patent Document 2 has the following problems. 4) Since the potential state of the power supply potential Vddma and the ground potential Vssma is determined by the threshold value Vt of the transistor, the leakage current can not be sufficiently reduced (accuracy of leakage current reduction is poor). 5) Since the potential state of the power supply potential Vddma and ground potential Vssma is determined by the threshold Vt of the transistor, it is difficult to retain the memory data.

In the embodiment of the present disclosure, a static random access memory (SRM) having a power supply for memory cells (VDDR) and a power supply for peripheral circuits (VDD) employs the following configuration. A) Switch the power supply to the memory array (22) or the memory cell (MC) between the power supply for the peripheral circuit (VDD) and the power supply for the memory cell (VDDR) by the resume standby (ResumeStandby) signal RS. (Switch the power supply by the power switch circuit (21)). B) arias a control signal (RSSW, LCMSW, LCMRSW, LCMNRSW, LCMNSW) to switch the power supplied to the memory array (22) or the memory cell (MC) in resume standby mode. C) The well potential of the N-type well (NW3) of the memory array (22) or the memory cell (MC) changes dynamically when entering and exiting from resume standby mode.

Thus, in the embodiments of the present disclosure, the following effects can be obtained. 1) Since the power supply switch circuits (21) switch the power supply levels (VDD, VDDR) of the memory arrays (22), the write characteristics and the read characteristics are not deteriorated. 2) To switch the power supply level (VDD, VDDR) of the memory array (22) in the power switch circuit (21), there is no need to change the output voltage of the regulator (25, 26) (VDD, VDDR). 3) Since the power switch circuits (21) can be switched between the resume standby mode and the normal operation mode, it is not necessary to perform power control individually for the memories (SRAM2). 4) Since the power supply for the memory cell (power supply for holding) (VDDR) is supplied from the regulator (26), the leakage current of the memory array (22) or the memory cell (MC) can be accurately reduced. 5) Since the memory cell power supply (holding power supply) (VDDR) is supplied from the regulator (26), the accuracy of the potential levels is high, and the holding characteristics of the memory array (22) or the memory cell (MC) can be stabilized.

Hereinafter, an embodiment will be described with reference to the drawings.

Embodiment 1

Figure 2:
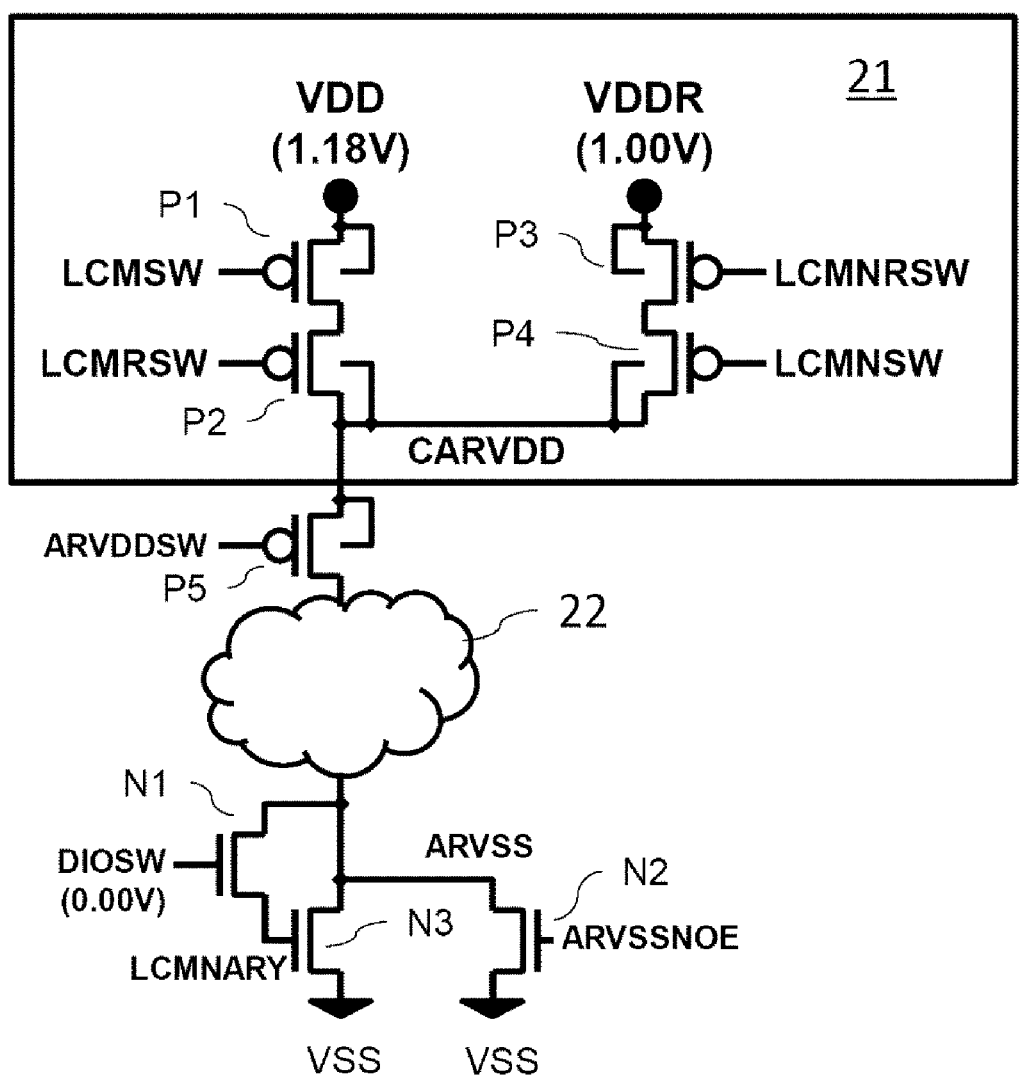
FIG. 2 is a diagram illustrating a configuration example of a power switch circuit of FIG. 1.
Figure 3:
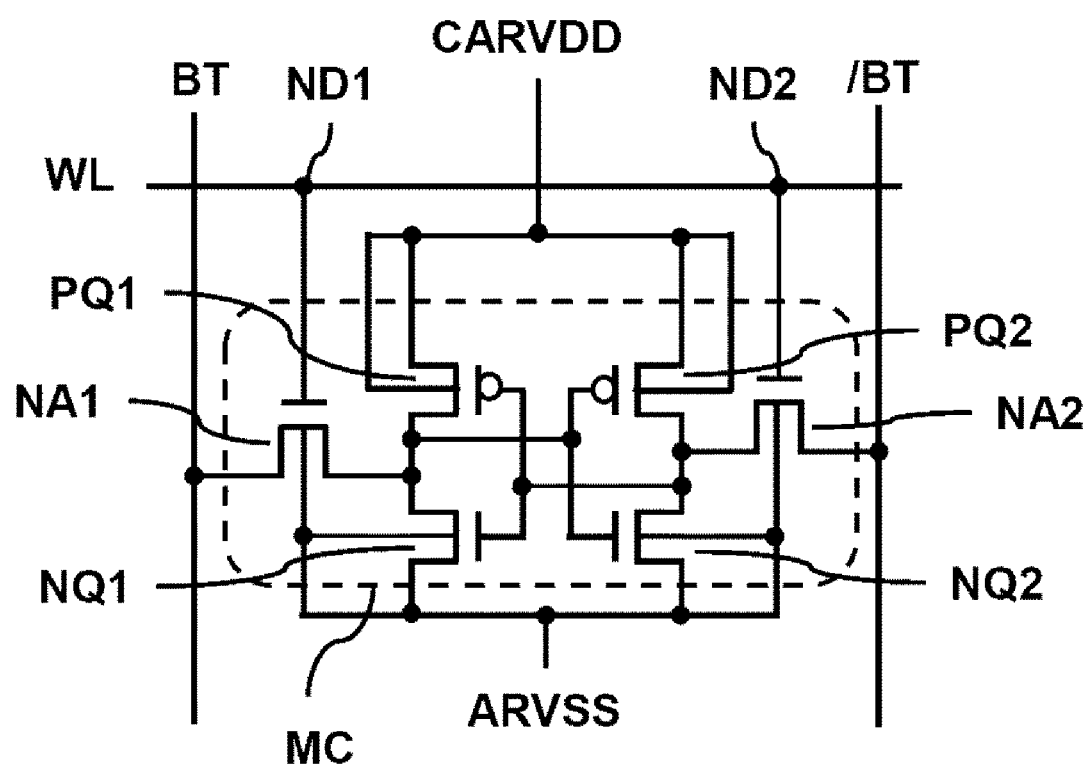
FIG. 3 is a circuit diagram showing a configuration example of a memory cell.

FIG. 1 is a block diagram illustrating a configuration example of a semiconductor device according to a first embodiment; FIG. 2 is a diagram illustrating a configuration example of a power switch circuit of FIG. 2. FIG. 3 is a circuit diagram showing a configuration example of a memory cell.

FIG. 1 shows the configuration example of a static random access memory (SRAM) 2 formed on a semiconductor substrate 10 made of, for example, single-crystal silicon. The SRAM 2 is a volatile memory incorporated in the semiconductor device 1, and is formed on the semiconductor board 10 together with a nonvolatile memory such as a central processing unit CPU, peripheral function circuits, and ROMs, which constitute a processor (not shown).

The SRAM 2 includes, for example, a power switch circuit 21, a memory array 22 including a plurality of memory cells, a memory peripheral circuit 23, a switch control signal generating circuit formed of the switch control signal generating circuit for generating a control signal of the power switch circuit 21 It includes such as a circuit 24. The memory peripheral circuit 23 includes, for example, a decoder, a read circuit including a sense amplifier, a write circuit including a write amplifier, an input/output circuit, and the like. The SRAM 2 is always supplied with resume standby signal RS, switch control signal RSSW and shut-down mode signal SDM.

The semiconductor substrate 10, further, a first regulator 25 and a second regulator 26 for generating a power to be supplied to the SRAM 2 is formed. The first regulator (VDD REG) 25 is the first power source potential generating circuit, for example, during its operation, generating a 1.18 V first power source potential (VDD) from its output terminal, and during its non-operation, its output terminal is in a high-impedance (HiZ) state. The second regulator (VDDR REG) 26 is a second power potential generating circuit, for example, during its operation, generating a second power potential (VDDR) of 1.00 V from its power terminals. The first power supply potential generated by the first regulator 25 (VDD) can also be referred to as a power supply for a peripheral circuit. The second power supply potential (VDDR) generated by the second regulator (VDDR REG) 26 can also be referred to as a power supply for a memory cell or a power supply for holding.

The second regulator (VDDR REG) 26 is configured to generate the second power supply potential (VDDR) of 1.00 V at all times when the power supply potential is supplied to the semiconductor device 1 or the semiconductor device SRAM2. Thus, the switch control signal generation circuit section 24 is constantly supplied with the second power supply potential (VDDR) of 1.00 V from the second regulator (VDDR REG) 26, and the switch control signal generation circuit formed in the switch control signal generation circuit section 24 is configured to be able to constantly generate a control signal for controlling the operation of the power supply switch circuit 21.

During the read operation (read) and the write operation (write), which are normal operations of the SRAM 2, the first power supply potential (VDD) of 1.18 V from the first regulator (VDD REG) 25 is supplied to the memory array 22 and the memory peripheral circuit 23. In the SRAM 2 resume operation (Resume or ResumeStandby), the second power supply potential (VDDR) of 1.00 V is supplied from the second regulator (VDDR REG) 26 to the memory array 22, and the first power supply potential (VDD) or the high-impedance (HiZ) status of 1.18 V is supplied from the first regulator (VDD REG) 25 to the memory peripheral circuit 23. In the SRAM 2 shutdown mode (SDM) the power supply potentials of the memory arrays 22 and the memory peripheral circuits 23 are set to high-impedance (HiZ) states.

An N-type well on which a PMOSFET (P-type metal oxide semiconductor field-effect transistor) is formed has three types of N-type wells in the power switch circuit 21. That is, the first N-type well NW1, the second N-type well NW2, and the third N-type well NW3. Similarly, the SRAM 2 has three types of N-type wells: a first N-type well NW1, a second N-type well NW2, and a third N-type well NW3. The first N-type well NW1 of the SRAM 2 is an N-type well in which PMOSFET of the memory peripheral circuit 23 is formed. The second N-type well NW2 of the SRAM 2 is an N-type well PMOSFET of the switch control signal generating circuit unit 24 is formed. The third N-type well NW3 of the SRAM 2 is an N-type well in which a PMOSFET of the memory cells of the memory array 22 (PQ1, PQ2 in FIG. 3) is formed.

The first N-type well NW1 is configured to be supplied with a first power supply potential VDD of 1.18 V from the first regulator 25. The second N-type well NW2 is configured to be supplied with a second power supply potential VDDR of 1.00 V from the second regulator 26. The third N-type well NW3 is configured to be supplied with an inner power supply potential CARVDD of the memory array 22.

As shown in FIG. 2, the power switch circuit 21 includes first to fourth PMOS transistors P1 to P4. Power switch circuit 21 includes a first regulator 25 and the second regulator 26, is provided between a fifth PMOS transistor P5 connected to the power supply side of the memory array 22.

The source-drain path of the first PMOS transistor P1 and the source-drain path of the second PMOS transistor P2 are connected in series between the output terminal of the first regulator 25 and the source-drain path of the fifth PMOS transistor P5.

The source-drain path of the first PMOS transistor P1 is configured co receive a first power supply potential VDD of 1.18 V from the output terminal of the first regulator 25. A gate of the first PMOS transistors P1 is configured to receive the first switching control signals LCMSW of 0.00 V or 1.18 V. The first PMOS transistor P1 is formed in the first N-type well NW1. Its source and back gate are configured to receive the voltage of the output terminal of the first regulator 25.

A gate of a second PMOS transistor P2 is configured to receive the second switching control signals LCMRSW of 0.00 V or 1.00 V. The second PMOS transistor P2 is formed in the third N-type well NW3. Its drain and the back gate are connected to the internal power supply potential CARVDD of the memory array 22.

The source-drain path of a third PMOS transistor P3 and the source-drain path of a fourth PMOS transistor P4 are connected in series between the output terminal of the second regulator 26 and the source-drain path of the fifth PMOS transistor P5. The serially connected fourth drain paths of the third PMS transistor P3 and the fourth PMOS transistor P4 and the serially connected fourth drain paths of the first PMOS transistor P1 and the second PMOS transistor P2 are connected to in parallel to the source-drain path of the fifth PMOS transistor P5.

The source-drain path of the third PMOS transistor P3 is configured to receive a second power supply potential VDDR of 1.00 V from the output terminal of the second regulator 26. The gate of the third PMOS transistors P3 is configured to receive the third switching control signals LCMNRSW of 0.00 V or 1.00 V. The PMOS transistor P3 is formed in the second N-type well NW2. Its source and the back gate are configured to receive the voltage of the output terminal of the second regulator 26.

The gate of the fourth PMOS transistors P4 is configured to receive fourth switch control signals LCMNSW of 0.00 V or 1.18 V. The fourth PMOS transistor P4 is formed in the third N-type well NW3. Its drain and the back gate are connected to the internal power supply potential CARVDD of the memory array 22.

The fifth PMOS transistor P5 connected to the power supply side of the memory array 22 has a gate that receives a fifth switch control signal ARVDDSW of 0.00 V or 1.00 V, and a source-drain path connected between the memory array 22 and the internal power supply potential CARVDD of the memory array 22. The fifth PMOS transistor P5 is formed in the third N-type well NW3. Its back gate is configured to receive the internal power supply potential CARVDD.

First to third NMOS transistors N1 to N3 are provided on the memory array 22 and the grounding potential VSS.

The source-drain path of the first NMOS transistor N1 is connected between the gate of and the inner grounding potential ARVSS of 3NMOS transistor N3. The gate of the first NOS transistor N1 is configured to receive the sixth switch control signal DIOSW of 0.00 V or 1.00 V.

The source-drain path of the second NMOS transistor N2 is connected between the inner ground potential ARVSS of the memory array 22 and the ground potential VSS. The gate of NMOS transistor N2 is configured to receive the seventh switch control signals ARVSSNOE of 0.00 V or 1.00 V.

The source-drain path of the third NMOS transistor N3 is connected between the inner ground potential ARVSS of the memory array 22 and the ground potential VSS. The gate of the third NMOS transistor N3 is configured to receive the eighth switch control signal LCMNARY. When the first NMOS transistor N1 is turned on by the sixth switch control signal DIOSW of 1.00 V, the second NMOS transistor N3 is diode-connected. Thus, the inner ground potential ARVSS will be a forward voltage of the diode (VF) higher potential than the ground potential VSS.

(Configuration example of a memory cell) Next, a configuration example of a memory cell will be described with reference to FIG. 3.

The circuit configuration of each of the plurality of memory cell MCs provided in the memory array 22 includes, in one example, two access transistors NA1,NA2, two load transistors PQ1, PQ2, and two drive transistors NQ1,NQ2, as shown in FIG. 3. Each of the access transistors NA1,NA2 and the drive transistor NQ1,NQ2 are N-channel MOS field-effect transistors, and the load transistors PQ1, PQ2 are P-channel MOS field-effect transistors. Load transistors PQ1,PQ2 are formed in the third N-type well NW3. Their back gates are configured to receive the internal power supply potential CARVDD. The load transistors PQ1,PQ2 may be referred to as a P-channel type load MOS transistors.

The source-drain path of the load transistor PQ1 and the source-drain path of the drive transistor NQ1 are connected in series between the internal power supply potential (memory cell power supply potential) CARVDD of the memory array 22 and the internal ground potential ARVSS of the memory array 22. The source-drain path of the load transistor PQ2 and the source-drain path of the drive transistor NQ2 are connected in series between the internal power supply potential CARVDD and the internal ground potential ARVSS.

The gate of the load transistor PQ1 and the gate of the driving transistor NQ1 are connected to constitute a common gate, the drain of the load transistor PQ2 and the drain of the driving transistor NQ2 are connected to constitute a common drain, the common gate of the load transistor PQ1 and the driving transistor NQ1 is connected to the common drain of the load transistor PQ2 and the driving transistor NQ2.

Similarly, the gate of the load transistor PQ2 and the gate of the driving transistor NQ2 are connected to constitute a common gate, the drain of the load transistor PQ1 and the drain of the driving transistor NQ1 are connected to constitute a common drain, the common gate of the load transistor PQ2 and the driving transistor NQ2 is connected to the common drain of the load transistor PQ1 and the driving transistor NQ1.

The source-drain path of the access transistor NA1 is connected between the bit-line BT of the complementary bit-line pair BT, /BT and the common drain of the load transistor PQ1 and the drive transistor NQ1. The gate of the access transistor NA1 is connected to the word line WL by a connecting node ND1. The source-drain path of the access transistor NA2 is connected between the bit-line/BT of the complementary bit-line pair BT, /BT and the common drain of the load transistor PQ2 and the drive transistor NQ2. The gate of the access transistor NA2 is connected to the word line WL by a connecting node ND2.

Figure 4:
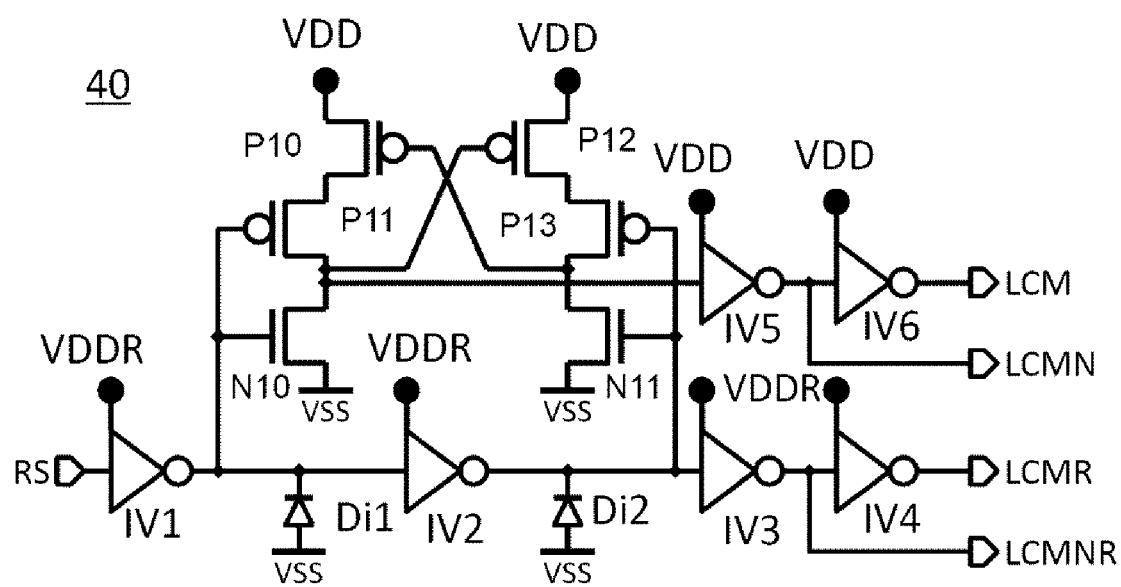
FIG. 4 is a circuit diagram showing a configuration example of a first switch control signal generation time.
Figure 5:
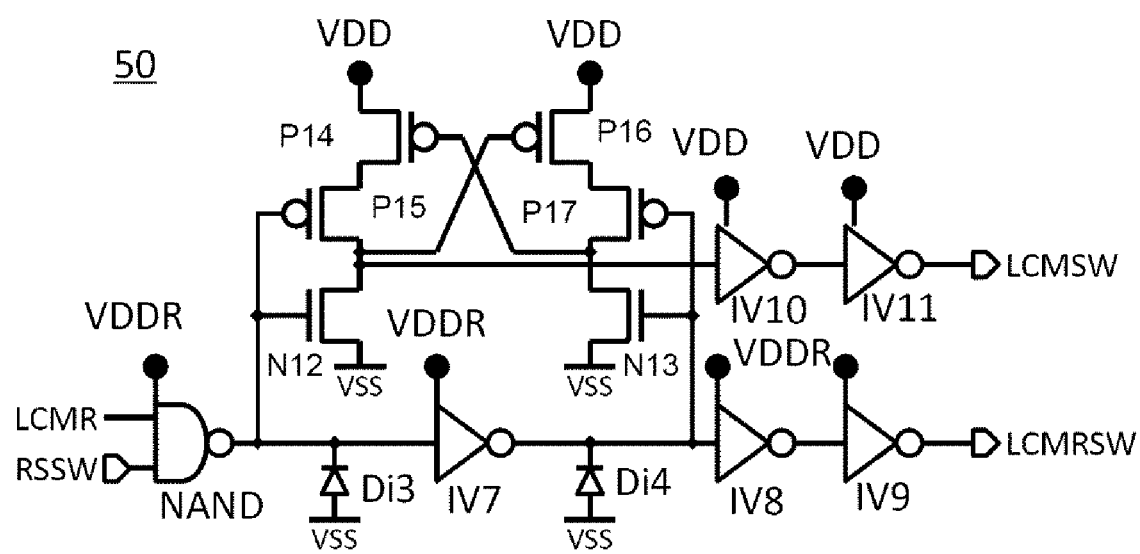
FIG. 5 is a circuit diagram showing a configuration example or a second switch control signal generation time.

(Configuration example of a switch control signal generating circuit) a configuration example of the first switch control signal generating circuit 40 and the second switch control signal generating circuit 50 formed in the switch control signal generating circuit unit 24 will be described with reference to FIGS. 4 and 5. FIG. 4 is a circuit diagram showing a configuration example of a first switch control signal generation time. FIG. 5 is a circuit diagram showing configuration example of a second switch control signal generation time. Note that a skill in art can understand the connection configuration by looking at FIG. 4 and FIG. 5, and therefore, in the following description of FIG. 4 and FIG. 5, the specific connection configuration will not be described.

As shown in FIG. 4, the first switch control signal generating circuit 40 receives the resume standby signal RS and generates four internal control signals (LCM, LCMN, LCMR, LCMNR). The first switch control signal generating circuit 40, in order to form an internal control signal LCMR, LCMNR, includes four inverters IV1 to IV4, and two diodes Di1, Di2. The inverters IV1 to IV4 are connected to an output terminal of the second regulator 26, and are configured to be supplied with a second power supply potential VDDR of 1.00 V. Therefore, the internal control signals LCMR, LCMNR are set to a value of 1.00 V or 0.00 V.

The first switch control signal generation circuit 40 includes four PMOS transistors P10 to P13, two MOS transistors N10,N11 and two inverters IN5, IN6 to form an internal control signals LCM, LCMN. PMOS transistors P10 and P12 and the inverters IN5, IN6 are connected to an output terminal of the first regulator 25 and are configured to receive a first power supply potential VDD of 1.18 V. Thus, the internal control signals LCM, LCMN are set to 1.18 V or 0.00 V.

As shown in FIG. 5, the second switch control signal generation circuit 50 receives the switch control, signal RSSH and the internal control signal LCMR generated by the first switch control signal generation circuit 40 to form the first switch control signal LCMSW. It also forms the second switch control signal LCMRSW. The signal level of the first switch control signal LCMSH is 0.00V (low level: L level), which is the signal level of the ground potential, or 1.18V (high level: H level), which is the signal level of the first power supply potential VDD. The signal level of the second switch control signal LCMRSW is 0.00V (low level: L level), which is the signal level of the Ground potential, or 1.00V (high level: H level), which is the signal level of the second power supply potential VDDR.

The second switch control signal generating circuit 50, for forming the second switch control signal LCMRSW, includes one NAND circuit NAND, three inverters IV7 to IV9, and two diodes Di3,Di4. The NAND circuit NAND and the inverters IV7 to IN9 are connected to an output terminal of the second regulator 26 and are supplied with a second power supply potential VDDR of 1.00 V.

The second switch control signal generation circuit 50 includes four PMOS transistors P14 to P17, two NMOS transistors N12, N13 and two inverters IN10, IN11 to form a first switch control signal LCMSW. The PMOS transistors P14 and P16 and the inverters IN10,IN11 are connected co an output terminal of the first regulator 25 and are configured to receive a first power supply potential VDD of 1.18V.

Although not shown, the generation of the third switch control signal LCMNRSW of 0.00 V (low level: L level) which is the signal level of the grounding potential or 1.00V (high level: H level) which is the signal level of the second power supply potential VDDR, and the generation of the fourth switch control signal LCMNSW of 0.00V (low level: L Level) or 1.18 V (high level: H level) which is the first power supply potential VDD can be formed by changing the internal control signal LCMR to the internal control signal LCMNR in the second switch control signal generation circuit 50 shown in FIG. 5.

As shown in FIG. 5, during the read operation and the write operation which is the normal operation of the SRAM 2, so that there is no problem with the operation even if the switch control signal RSSW transitions, the switch control signal RSSW by taking the logic with the resume standby signal RS (internal control signal LCMR, LCMNR) at the first stage of the signal RSSW taking measures.

(Explanation of SRAM operation) Hereinafter, the operation of SRAM2 will be described with reference to FIGS. 6 to 12.

Figure 6:
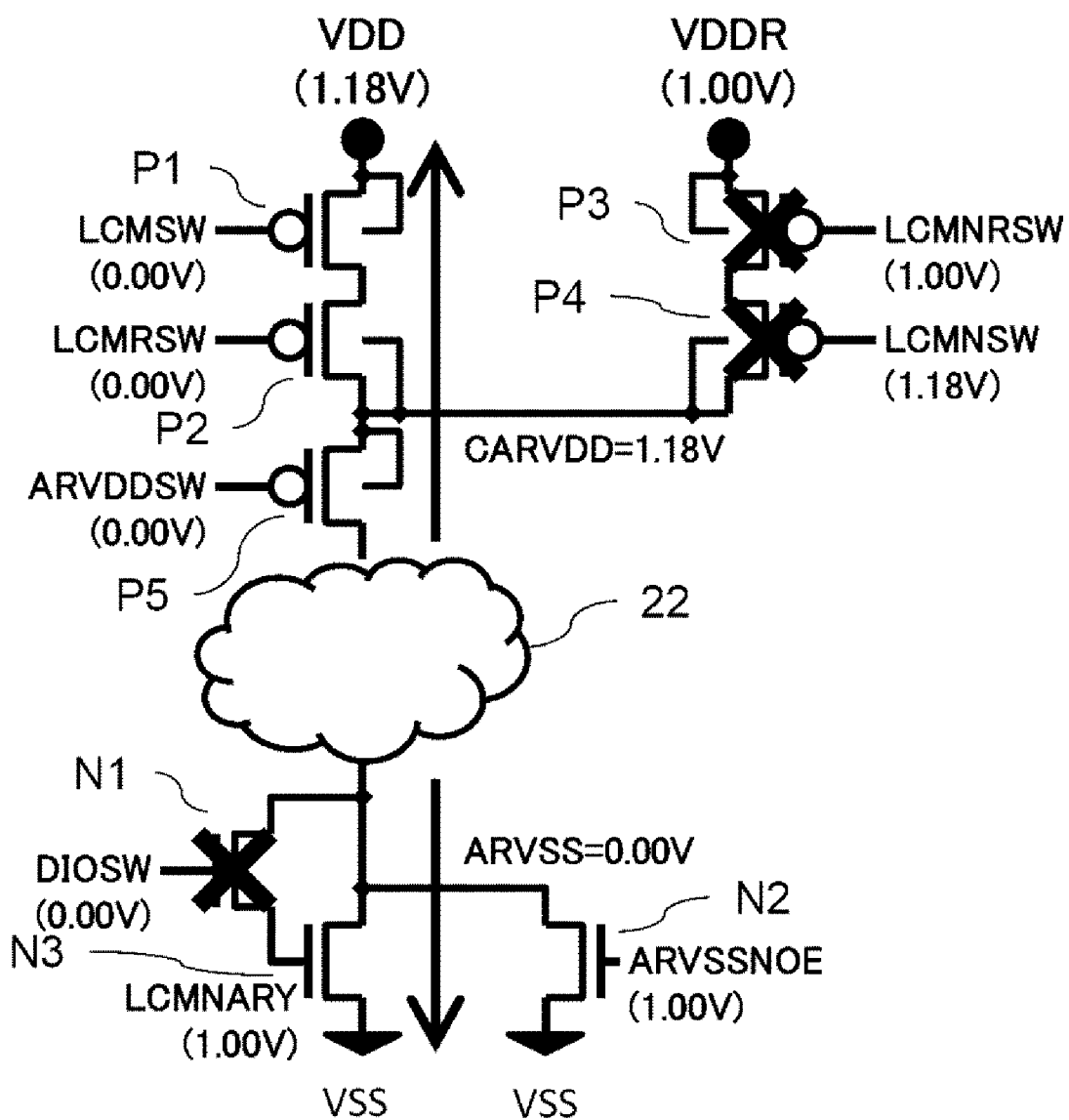
FIG. 6 is a diagram for explaining a normal operation of an SRAM 2.

FIG. 6 is a diagram for explaining a normal operation of SRAM 2. As shown in FIG. 6, each transistor is controlled.

The first PMOS transistor P1 is turned on when the first switching control signal LCMSW is 0.00 V. The second PMOS transistor P2 is turned on when the second switching control signal LCMRSW is 0.00 V. The third PMOS transistor P3 is turned off when the third switch control signal LCMNRSW is 1.00 V. The fourth PMOS transistor P4 is turned off when the fourth switch control signal LCMNSW is 1.18 V. The fifth PMOS transistor P5 is turned on when the fifth switch control signal ARVDDSW is 0.00 V. The first NMOS transistor N1 is turned off when the sixth switch control signal DIOSW is 0.00 V. The second NMOS transistor N2 is turned on when the seventh switching control signal ARVSSNOE is 1.00 V. The third NMOS transistor N3 is turned on when the eighth switching control signal LCMNARY is 1.00 V.

The back-gate of the first PMOS transistor P1 is set to the first power supply potential VDD of 1.18 V. The back-gate of the second PMOS transistor P2 is an internal power supply potential CARVDD. The back-gate of the fourth PMOS transistor P4 is an internal power supply potential CARVDD. The inner power supply potential CARVDD is 1.18 V. The back gate of the fifth PMOS transistor P5 is an internal power supply potential CARVDD, and the internal power supply potential CARVDD (1.18 V) is supplied to the memory cell.

Figure 7:
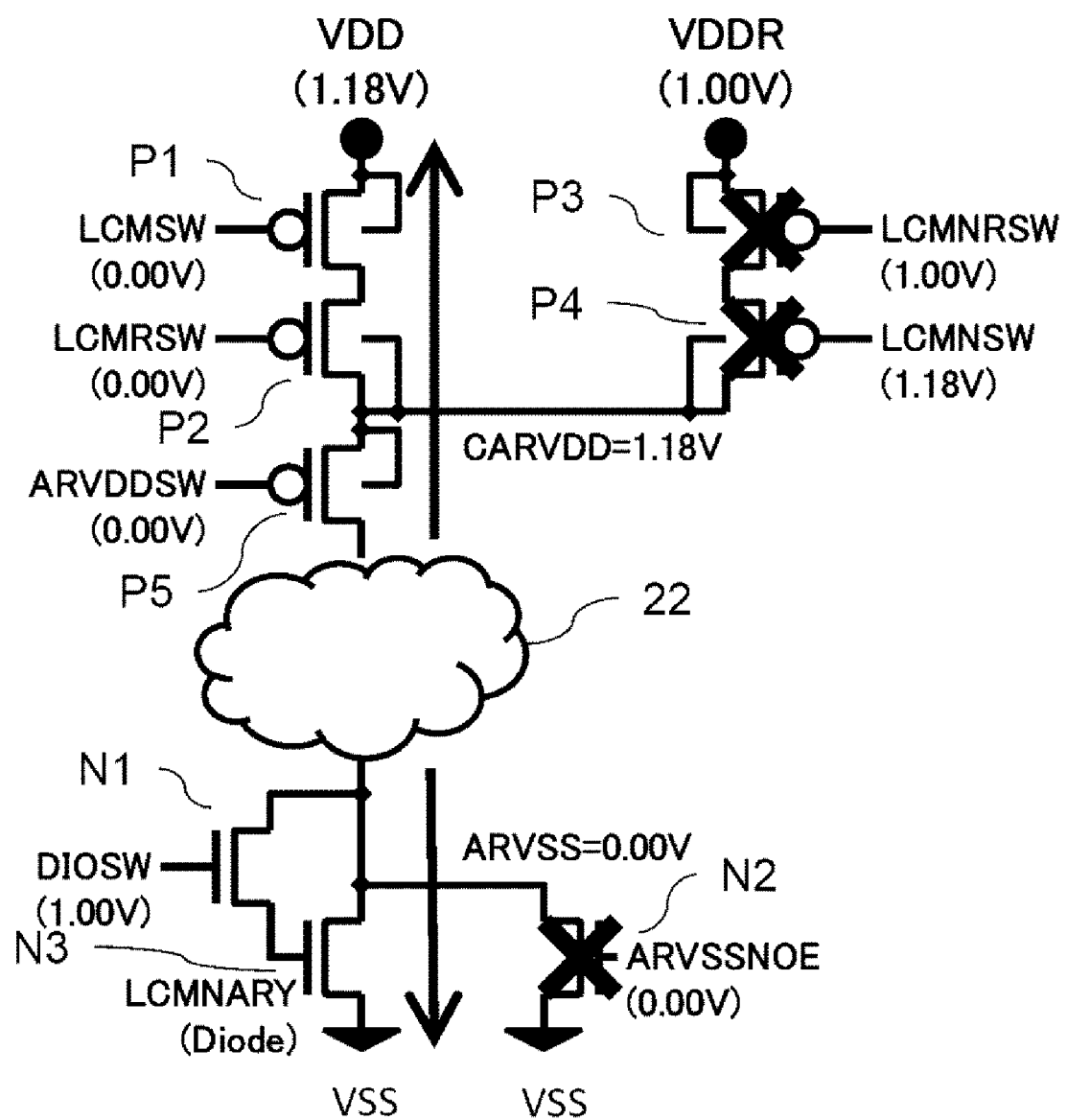
FIG. 7 is a diagram for explaining the first resume standby operation of the SRAM 2.

FIG. 7 is a diagram illustrating a first resume standby operation of the SRAM 2. As shown in FIG. 7, each transistor is controlled. The first resume standby operation, the first regulator 25 is turned on (VDD=ON, 1.18 V), the switch control signal RSSW is turned off (RSSW=0).

The first PMOS transistor P1 is turned on when the first switching control signal LCMSW is 0.00 V. The second PMOS transistor P2 is turned on when the second switching control signal LCMRSW is 0.00 V. The third PMOS transistor P3 is turned off when the third switch control signal LCMNRSW is 1.00 V. The fourth PMOS transistor P4 is turned off when the fourth switch control signal LCMNSW is 1.18 V. The fifth PMOS transistor P5 is turned on when the fifth switch control signal ARVDDSW is 0.00 V. The first NMOS transistor N1 is turned on when the sixth switch control signal DIOSW is 1.00 V. The second NMOS transistor N2 is turned off when the seventh switching control signal ARVSSNOE is 0.00 V. The third NMOS transistor N3 is set to a diode-connected state by the eighth switch control signal LCMNARY becoming a drain potential of the second NMOS transistor N2.

The back-gate of the first PMOS transistor P1 is set to the first power supply potential VDD of 1.18 V. The back-gate of the second PMOS transistor P2 is an internal power supply potential CARVDD. The back-gate of the fourth PMOS transistor P4 is an internal power supply potential CARVDD. The inner power supply potential CARVDD is 1.18 V. The back gate of the fifth PMOS transistor P5 is an internal power supply potential CARVDD, and the internal power supply potential CARVDD (1.18 V) is supplied to the memory cell.

Figure 8:
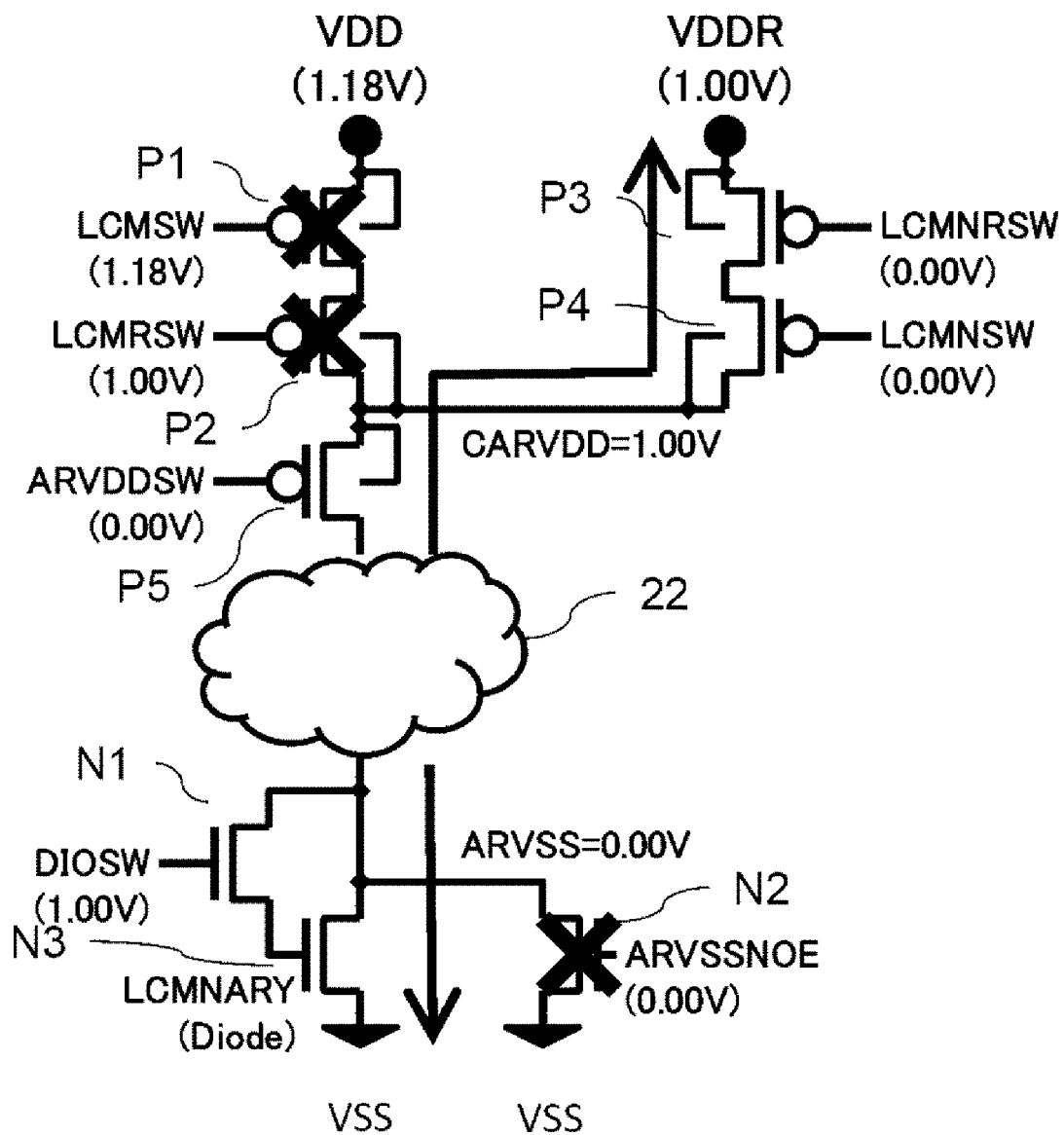
FIG. 8 is a diagram for explaining the second resume standby operation of the SRAM 2.

(3. second resume standby operation) FIG. 8 is a diagram illustrating a second resume standby operation of the SRAM 2. As shown in FIG. 8, each transistor is controlled. At the second resume standby operation, the first regulator 25 is turned on (VDD=ON, 1.18 V), the switch control signal RSSW is turned on (RSSW=1).

The first PMOS transistor P1 is turned off when the first switching control signal LCMSW is 1.18 V. The second PMOS transistor P2 is turned off when the second switching control signal LCMRSW is 1.00 V. The third PMOS transistor P3 is turned on when the third switching control signal LCMNRSW is 0.00 V. The fourth PMOS transistor P4 is turned on when the fourth switch control signal LCMNSW is 0.00 V. The Fifth PMOS transistor P5 is turned on when the fifth switch control signal ARVDDSW is 0.00 V. The first NMOS transistor N1 is curried on when the sixth switch control signal DIOSW is 1.00 V. The second NMOS transistor N2 is turned off when the seventh switching control signal ARVSSNOE is 0.00 V. The third NMOS transistor N3 is set to a diode-connected state by the eighth switch control signal LCMNARY becoming a drain potential of the third NMOS transistor N3.

The back-gate of the third PMOS transistor P3 is set to the second power supply potential VDD of 1.00 V. The back-gate of PMOS transistor P4 is an internal power supply potential CARVDD. The inner power supply potential CARVDD is 1.00 V. The back gate of the fifth PMOS transistor P5 is an internal power supply potential CARVDD, and the internal power supply potential CARVDD (1.00 V) is supplied to the memory cell.

Figure 9:
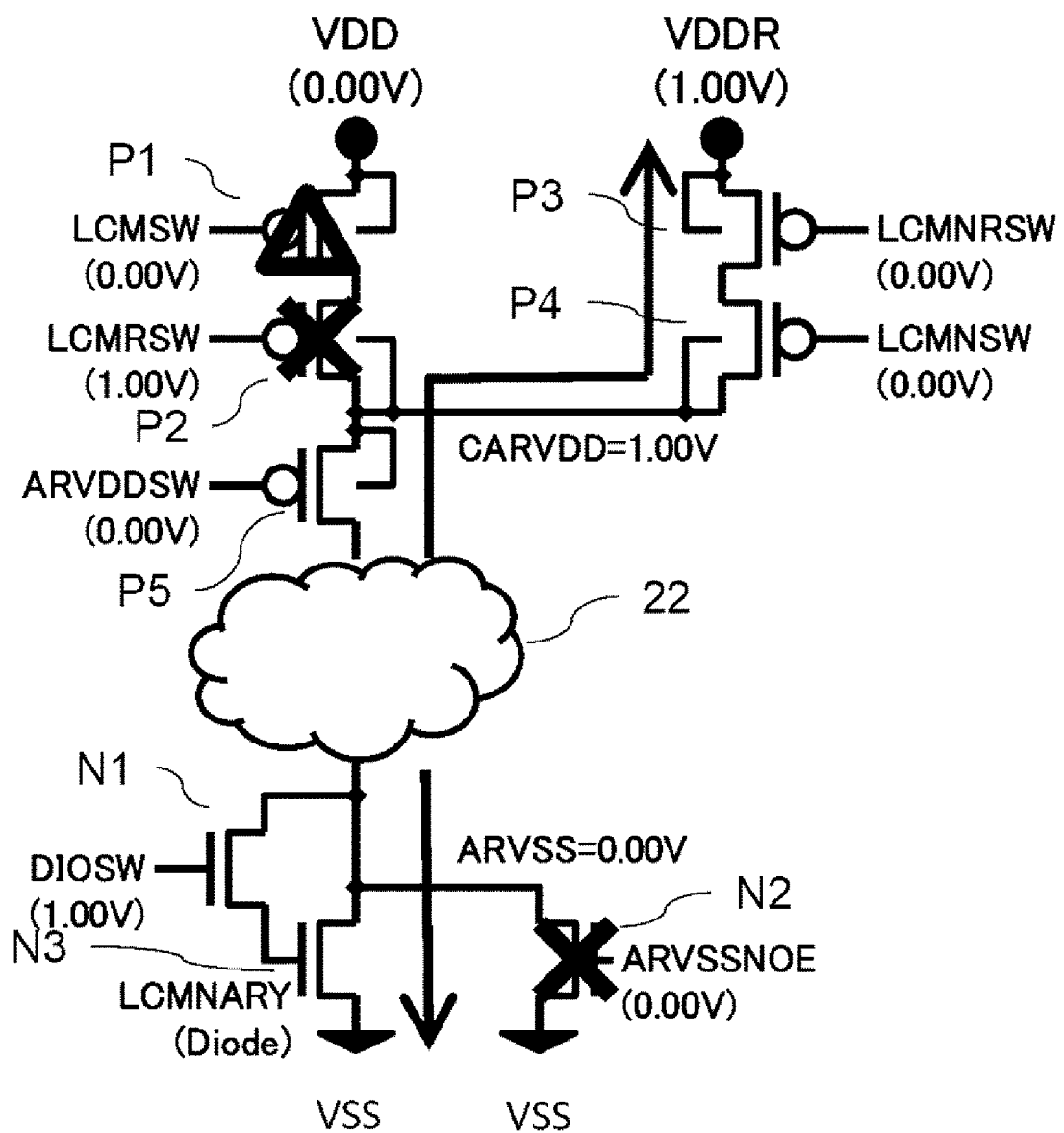
FIG. 9 is a diagram for explaining the third resume standby operation of the SRAM 2.

(4. third resume standby operation) FIG. 9 is a diagram illustrating a third resume standby operation of the SRAM 2. As shown in FIG. 9, each transistor is controlled. In the third resume standby operation, the first regulator 25 is turned off (VDD=OFF, 0.00 V), and the switching control signal RSSW is turned on (RSSW=1).

In the first PMOS transistor P1, the first switching control signal LCMSW is 0.00 V. The second PMOS transistor P2 is turned off when the second switching control signal LCMRSW is 1.00 V. The third PMOS transistor P3 is turned on when the third switching control signal LCMNRSW is 0.00 V. The fourth PMOS transistor P4 is turned on when the fourth switch control signal LCMNSW is 0.00 V. The fifth PMOS transistor P5 is turned on when the fifth switch control signal ARVDDSW is 0.00 V. The first NMOS transistor N1 is turned on when the sixth switch control signal DIOSW is 1.00 V. The second NMOS transistor N2 is turned off when the seventh switching control signal ARVSSNOE is 0.00 V. The third NMOS transistor N3 is set to a diode-connected state by the eighth switch control signal LCMNARY becoming a drain potential of the third NMOS transistor N3.

The back-gate of the first PMOS transistor P1 is set to 0.00 V. The back-gate of the second PMOS transistor P2 is an internal power supply potential CARVDD. The back-gate of the fourth PMOS transistor P4 is an internal power supply potential CARVDD. The inner power supply potential CARVDD is 1.00 V. The back gate of the fifth PMOS transistor P5 is an internal power supply potential CARVDD, and the internal power supply potential CARVDD (1.00 V) is supplied to the memory cell.

Figure 10:
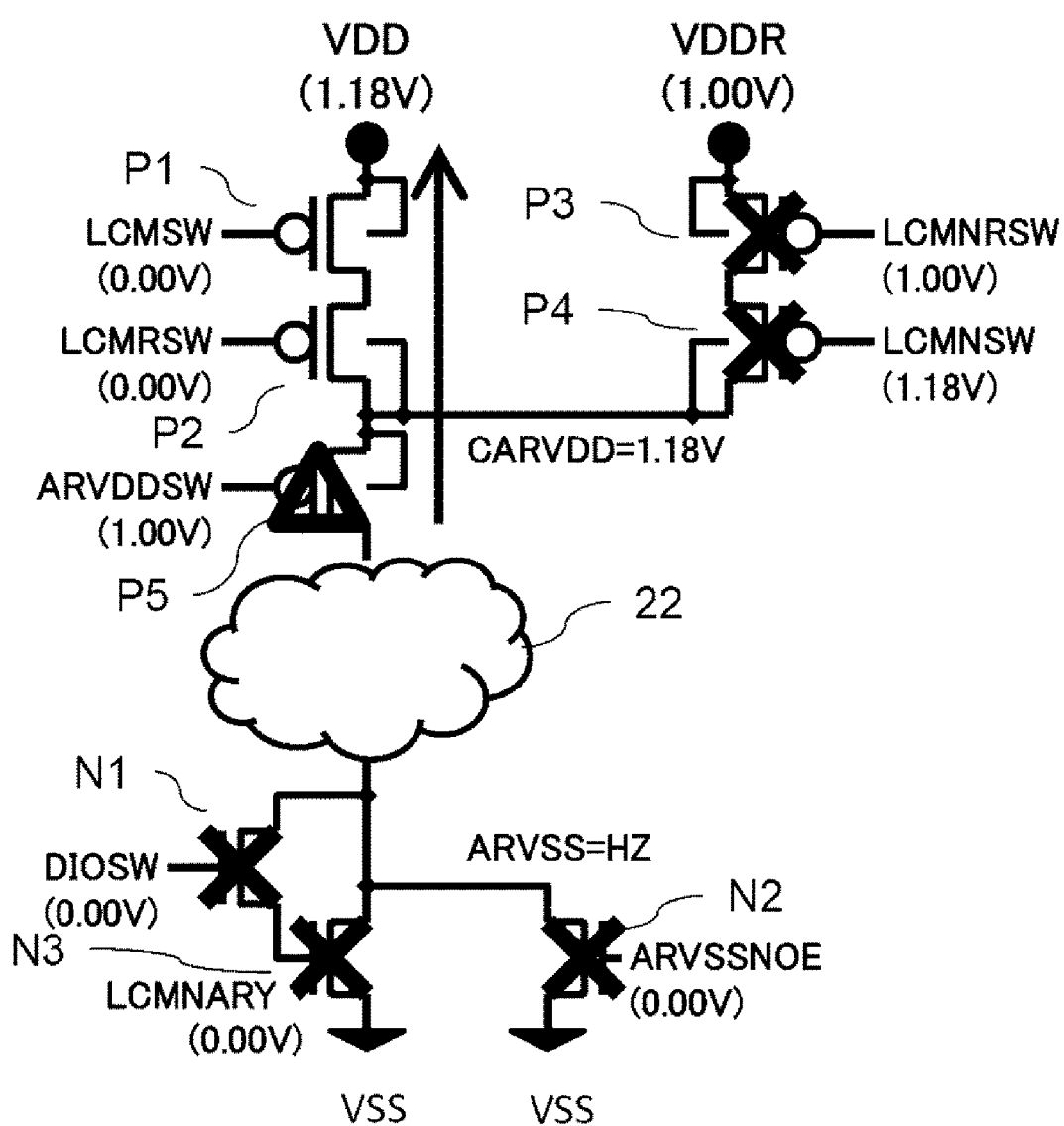
FIG. 10 is a diagram for explaining the first shutdown mode operation of the SRAM 2.

(5. first shutdown mode operation) FIG. 10 is a diagram illustrating a first shutdown mode operation of the SRAM 2. As shown in FIG. 10, each transistor is controlled. The first shutdown mode operation, the first regulator 25 is turned on (VDD=ON, 1.18V), the switch control signal RSSW is turned off (RSSW=0).

The first PMOS transistor P1 is turned on when the first switching control signal LCMSW is 0.00 V. The second PMOS transistor P2 is turned on when the second switching control signal LCMRSW is 0.00 V. The third PMOS transistor P3 is turned off when the third switch control signal LCMNRSW is 1.00 V. The fourth PMOS transistor P4 is turned off when the fourth switch control signal LCMNSW is 1.18 V. The fifth PMOS transistor P5 is halfway off with a fifth switch control signal ARVDDSW of 1.00 V. The first NMOS transistor N1 is turned off when the sixth switch control signal DIOSW is 0.00 V.

The second NMOS transistor N2 is turned off when the seventh switching control signal ARVSSNOE is 0.00 V. The third NMOS transistor N3 is turned off when the eighth switch control signal LCMNARY is 0.00 V.

The back-gate of the first PMOS transistor P1 is set to 1.18 V. The back-gate of the second PMOS transistor P2 is an internal power supply potential CARVDD. The back-gate of the fourth PMOS transistor P4 is an internal power supply potential CARVDD. The inner power supply potential CARVDD is 1.18 V. The back-gate of the fifth PMOS transistor P5 is an internal power supply potential CARVDD, and the internal power supply potential CARVDD (1.18 V) is supplied to the memory cell with a weak capability.

Figure 11:
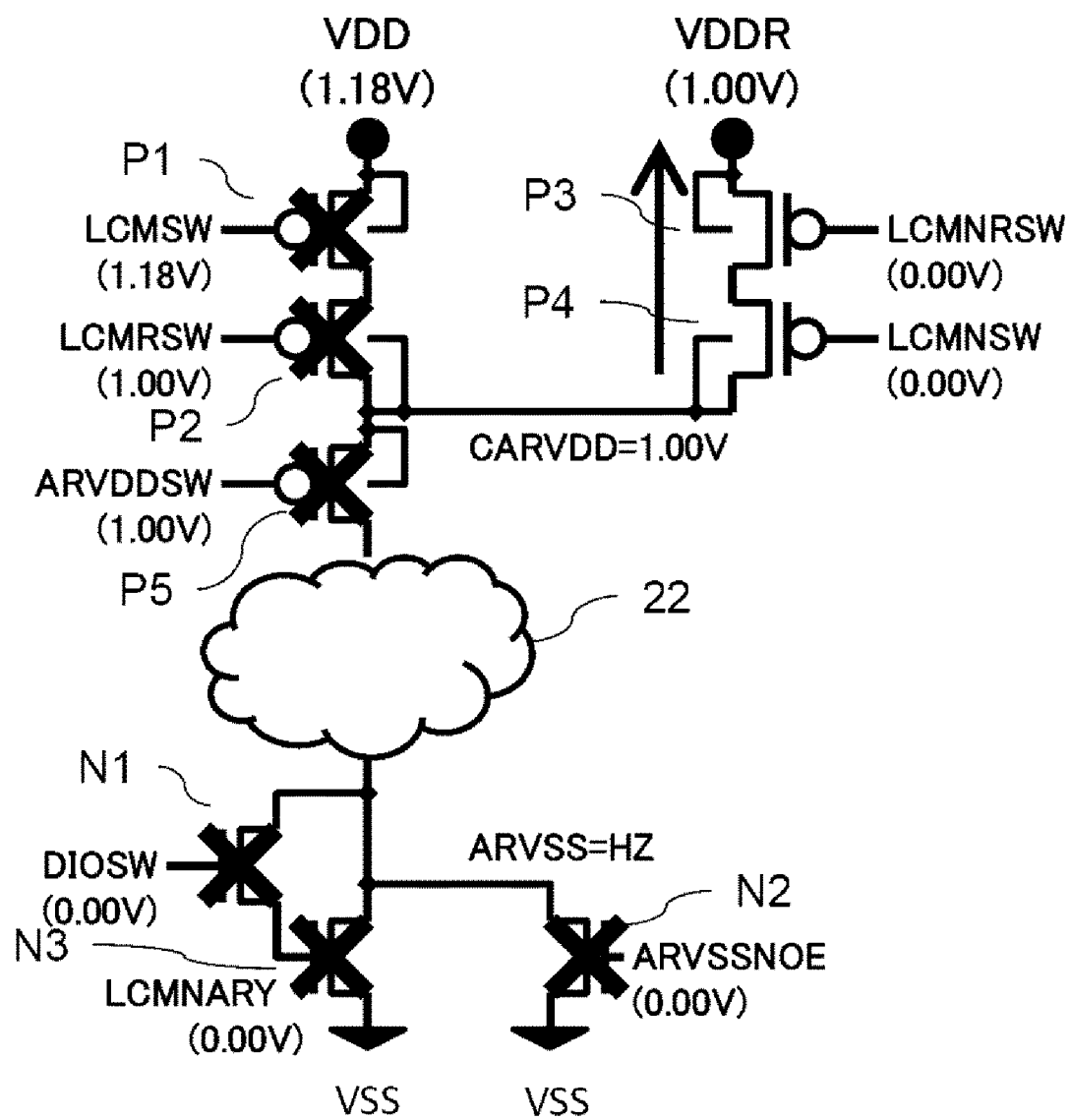
FIG. 11 is a diagram for explaining the second shutdown mode operation of the SRAM 2.

(6. second shutdown mode operation) FIG. 11 is a diagram illustrating a second shutdown mode operation of the SRAM 2. As shown in FIG. 11, each transistor is controlled. The second shutdown mode operation, the first regulator 25 is turned on (VDD=ON, 1.18 V), the switch control signal RSSW is curried on (RSSW=1).

The first PMOS transistor P1 is turned off when the first switching control signal LCMSW is 1.18 V. The second PMOS transistor P2 is turned off when the second switching control signal LCMRSW is 1.00 V. The third PMOS transistor P3 is turned on when the third switching control signal LCMNRSW is 0.00 V. The fourth PMOS transistor P4 is turned on when the fourth switch control signal LCMNSW is 0.00 V. The fifth PMOS transistor P5 is turned off when the fifth switch control signal ARVDDSW is 1.00 V. The first NMOS transistor N1 is turned off when the sixth switch control signal DIOSW is 0.00 V. The second NMOS transistor N2 is turned off when the seventh switching control signal ARVSSNOE is 0.00 V. The third NMOS transistor N3 is turned off when the eighth switch control signal LCMNARY is 0.00 V.

The back-gate of the first PMOS transistor P1 as set to 1.18 V. The back-gate of the second PMOS transistor P2 is an internal power supply potential CARVDD. The back-gate of the fourth PMOS transistor P4 is an internal power supply potential CARVDD. The inner power supply potential CARVDD is 1.00 V. The back gate of the fifth PMOS transistor P5 is an internal power supply potential CARVDD, and the internal power supply potential CARVDD (1.00 V) is not supplied to the memory cell.

Figure 12:
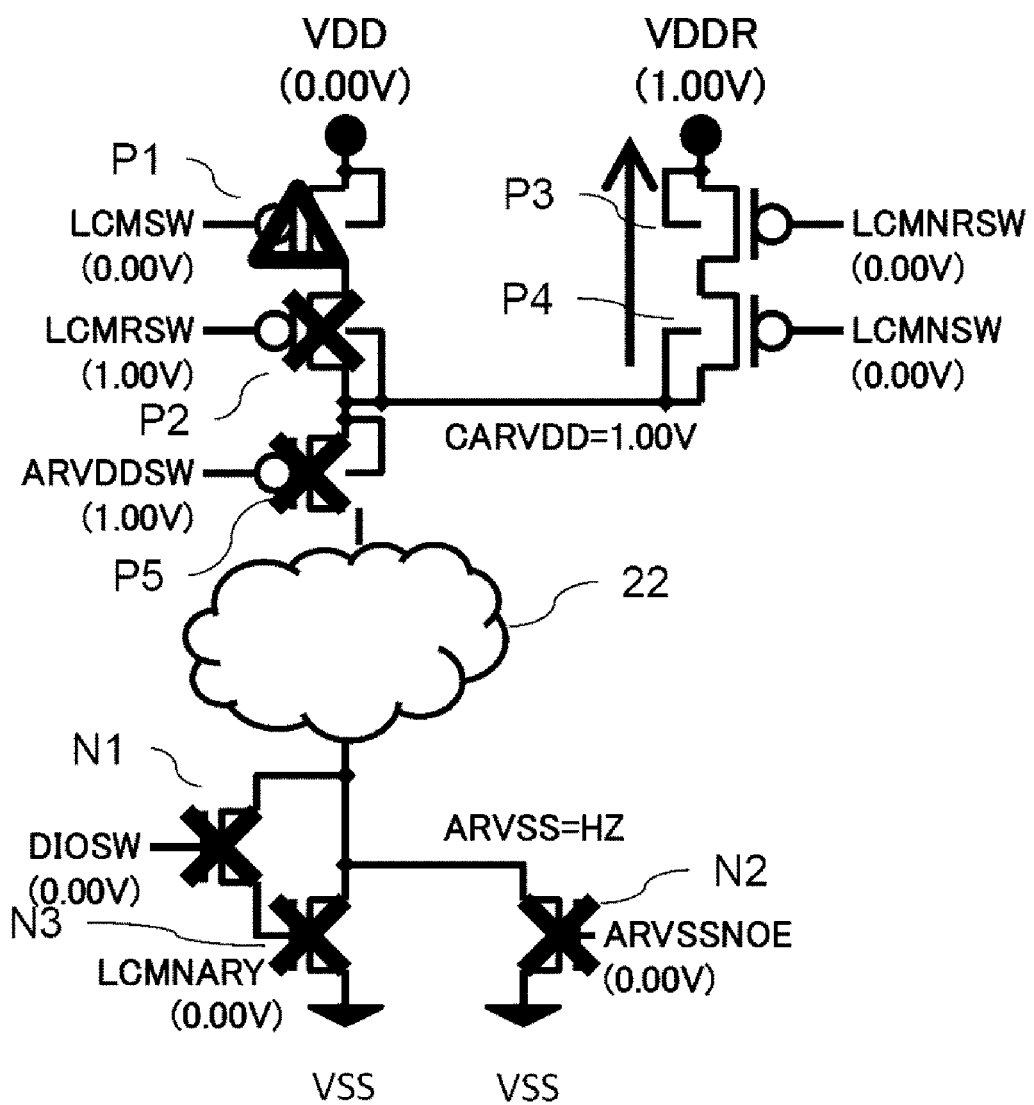
FIG. 12 is a diagram for explaining the third shutdown mode operation of the SRAM 2.

(7. third shutdown mode operation) FIG. 12 is a diagram illustrating a third shutdown mode operation of the SRAM 2. As shown in FIG. 12, each transistor is controlled. In the third shutdown mode operation, the first regulator 25 is turned off (VDD=OFF, 0.00 V), and the switching control signal RSSW is turned on (RSSW=1).

In the first PMOS transistor P1, the first switching control signal LCMSW is set to 0.00 V. The second PMOS transistor P2 is turned off when the second switching control signal LCMRSW is 1.00 V. The third PMOS transistor P3 is turned on when the third switching control signal LCMNRSW is 0.00 V. The fourth PMOS transistor P4 is turned on when the fourth switch control signal LCMNSW is 0.00 V. The fifth PMOS transistor PP is turned off when the fifth switch control signal ARVDDSW is 1.00 V. The first NMOS transistor N1 is turned off when the sixth switch control signal DIOSW is 0.00 V. The second NMOS transistor N2 is turned off when the seventh switching control signal ARVSSNOE is 0.00 V. The third NMOS transistor N3 is turned off when the eighth switch control signal LCMNARY is 0.00 V.

The back-gate of the first PMOS transistor P1 is set to 0.00 V. The back-gate of the second PMOS transistor P2 is an internal power supply potential CARVDD. The back-gate of the fourth PMOS transistor P4 is an internal power supply potential CARVDD. The inner power supply potential CARVDD is 1.00 V. The back gate of the fifth PMOS transistor P5 is an internal power supply potential CARVDD, and the internal power supply potential CARVDD (1.00 V) is not supplied to the memory cell.

Next, the mode transition of the SRAM 2 will be described with reference to FIGS. 13 to 18. Incidentally, in FIGS. 13 to 18, the shutdown mode SMD, the resume standby signal RS, the switch control signal RSSW and the NMA signal are assumed to be always definite (=0 V, or VDDR (=1.00 V)).

Figure 13:
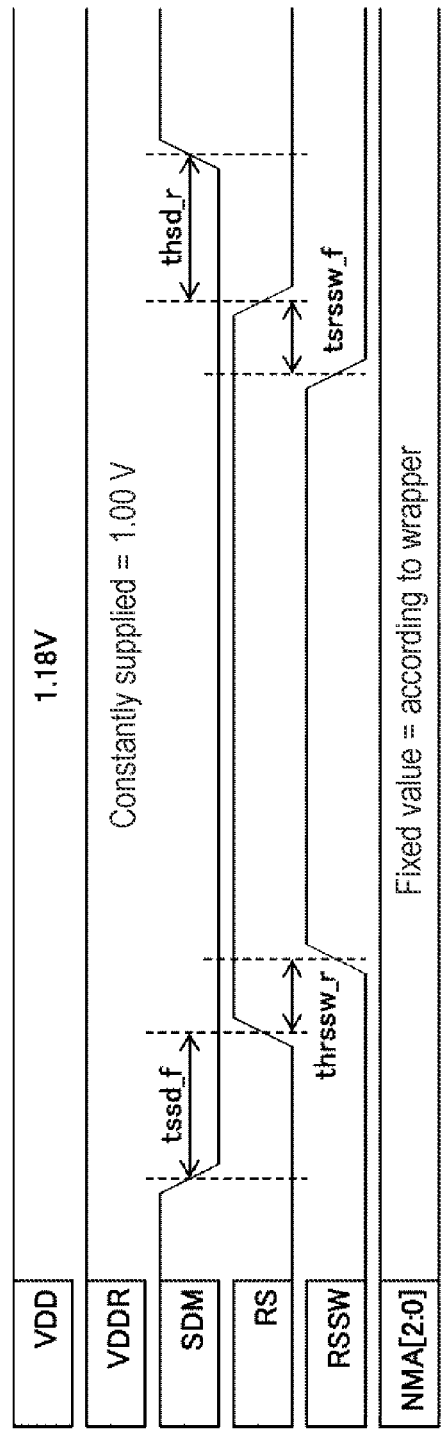
FIG. 13 is a diagram showing a resume standby mode transition in the VDD supply state (VDD=1.18 V).

(1. Resume standby mode transition in VDD supply state (VDD=1.18 V)) FIG. 13 is a diagram showing the resume standby mode transition in the VDD supply state (VDD=1.18 V). As shown in FIG. 13, the first regulator 25 generates a first power supply potential (VDD) of 1.18 V (VDD=1.18V), and the second regulator 26 generates a second power supply potential (VDDR) of 1.00 V, and is constantly supplied (VDDR=1.00V).

First, when the SRAM 2 is shifted from the shutdown mode to the resume standby mode, the shutdown mode signal SMD is shifted from 1.00 V to 0.00 V, and then the resume standby signal RS is shifted from 0.00 V to 1.00 V. Thereafter, the switch control signal RSSW is shifted from 0.00 V to 1.00 V. This causes the SRAM 2 to transition from shutdown mode to resume standby mode.

When the SRAM 2 is changed from the resume standby mode to the shutdown mode, the switch control signal RSSW is changed from 1.00 V to 0.00 V, and then the resume standby signal RS is changed from 1.00 V to 0.00 V. Thereafter, the shutdown mode signal SMD is transited from 0.00 V to 1.00 V. This causes the SRAM 2 to transition from resume standby mode to shutdown mode.

Between the falling of the shutdown mode signal SMD and the rising of the resume standby signal RS, for example, a time tssd_f is provided. The time between the rise of the resume standby signal RS and the rise of the switching control signal RSSW has, for example, a time thrssw-r. The time between the falling of the switching control signal RSSW and the falling of the resume standby signal RS has, for example, a time thsrsw-f. Between the falling of the resume standby signal RS and the rising of the shutdown mode signal SMD, a time thsd_r is provided.

Figure 14:
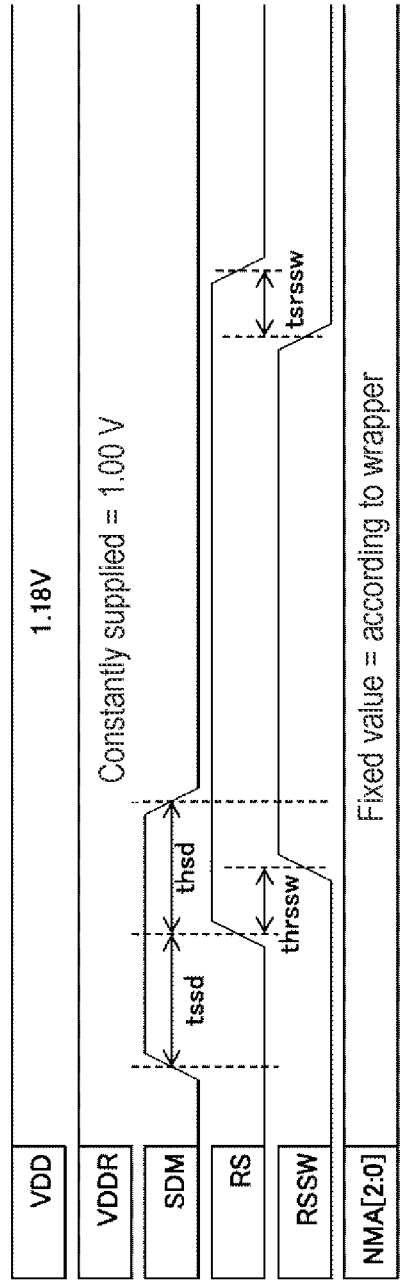
FIG. 14 is a diagram showing a shutdown mode transition in the VDD supply state (VDD=1.18 V).

(2. Shutdown mode transition in VDD supply state (VDD=1.18 V)) FIG. 14 is a diagram showing the shutdown mode transition in the VDD supply state (VDD=1.18 V). As shown in FIG. 14, the first regulator 25 generates a first power supply potential (VDD) of 1.18 V (VDD=1.18V), and the second regulator 26 generates a second power supply potential (VDDR) of 1.00 V, and is constantly supplied (VDDR=1.00V).

When the SRAM 2 is transited to the shutdown mode, the shutdown mode signal SMD is transited from 0.00 V to 1.00 V.

To cancel the SRAM 2 shutdown mode, the resume standby signal RS is first transited from 0.00 V to 1.00 V while the shutdown mode signal SMD is 1.00 V, and then the switching control signal RSSW is transited from 0.00 V to 1.00 V. Thereafter, the shutdown mode signal SMD is transited from 1.00 V to 0.00 V, and then the switch control signal RSSW is transited from 1.00 V to 0.00 V, and finally, the resume standby signal RS is transited from 1.00 V to 0.00 V.

The period between the rise of the shutdown mode signal SMD and the rise of the resume standby signal RS has a temporal tssd. Between the start-up of the resume standby, signal RS and the start-up of the switch control signal RSSW, it has a time thrssw. Between the start-up of the resume standby signal RS and the fall-down of the shutdown mode signal SMD, it has a time thsd. Between the fall of the switch control signal RSSW and the fall of the resume standby signal RS, it has a time tsrssw.

Figure 15:
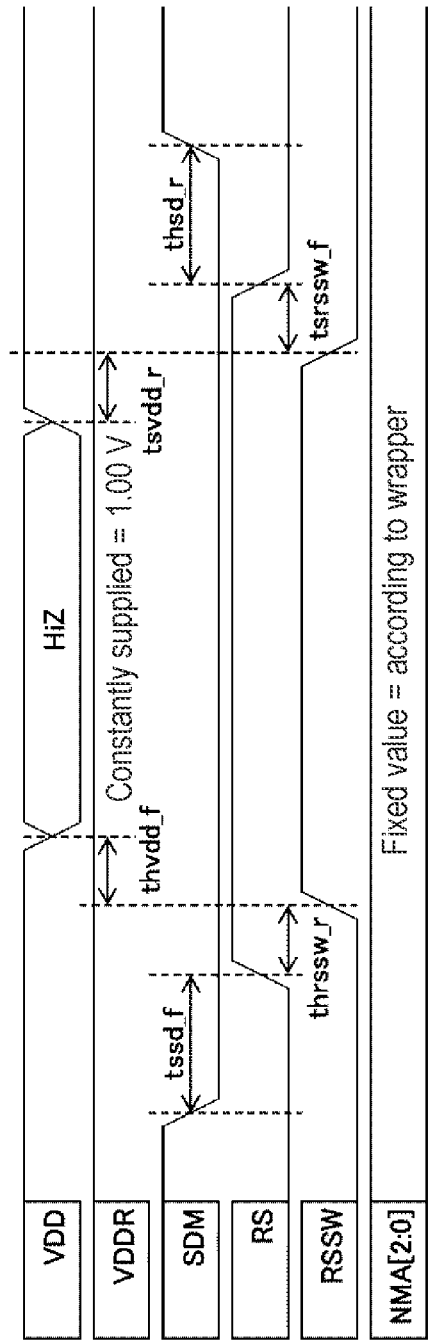
FIG. 15 is a diagram showing resume standby mode transition in a state where VDD is not supplied (VDD=Hi-Z).

(3. Resume standby mode transition in the state of VDD supply (VDD=HiZ)) FIG. 15 is a diagram showing the transition to resume standby mode in the state of no VDD supply (VDD=HiZ). FIG. 15 differs from FIG. 13 in that, in FIG. 15, the output terminal (output potential) of the first regulator 25 changes from 1.18 V to high-impedance (HiZ) while the switching control signal RSSW is 1.00 V. The rest of the configuration of FIG. 15 is the same as that of FIG. 13, and a description thereof will be omitted.

After a lapse of time thvdd-f after the switch control signal RSSW is transited from 0.00 V to 1.00 V, the output terminal (output potential) of the first regulator 25 becomes high-impedance (HiZ). When the output terminal (output potential) of the first regulator 25 is transited from the high-impedance (HiZ) state to 1.18 V, the switch control signal RSSW falls from 1.00 V to 0.00 V after the elapse of the time tsvdd-r.

Figure 16:
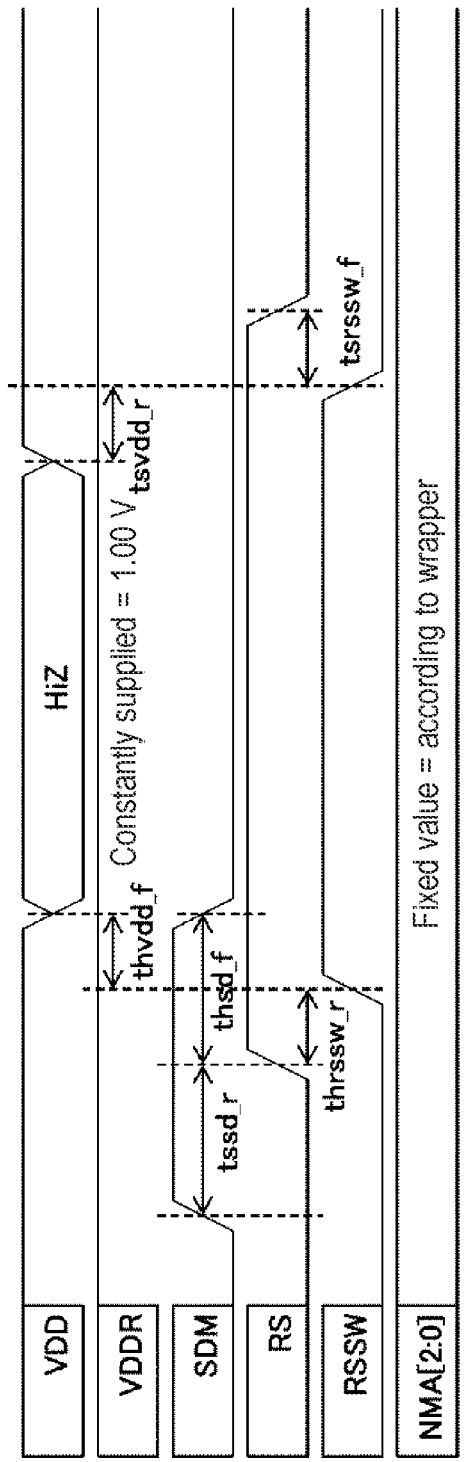
FIG. 16 is a diagram showing a shutdown mode transition in a condition where VDD is not supplied (VDD Hi-Z).

(Shutdown mode transition in the state without VDD supply (VDD=HiZ)) FIG. 16 is a diagram showing the shutdown mode transition in the state without VDD supply (VDD=HiZ). FIG. 16 differs from FIG. 14 in that, in FIG. 16, the output terminal (output potential) of the first regulator 25 changes from 1.18 V to high-impedance (HiZ) while the switching control signal RSSW is 1.00 V. The rest of the configuration of FIG. 16 is the same as that of FIG. 14, and a description thereof will be omitted.

After a time thvdd-f after the switch control signal RSSW is transited from 0.00 V to 1.00 V, the output terminal (output potential) of the first regulator 25 becomes high-impedance (HiZ). When the output terminal (output potential) of the first regulator 25 is transited from the high-impedance (HiZ) state to 1.18 V the switch control signal RSSW falls from 1.00V to 0.00V after the elapse of the time tsvdd-r.

Figure 17:
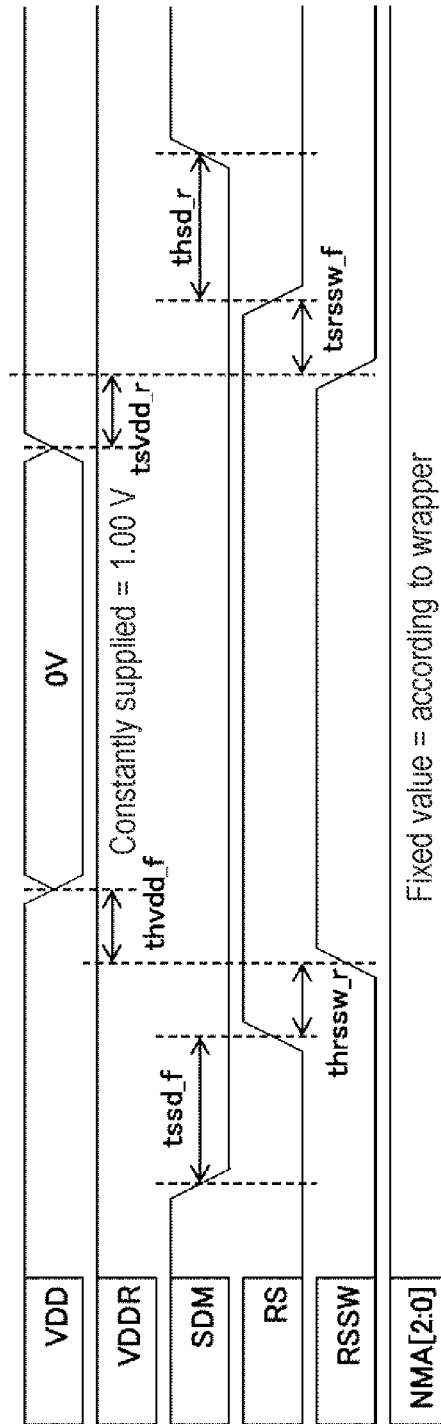
FIG. 17 is a diagram showing a resume standby mode transition in the VDD=0 V state.

(5. Resume standby mode transition in VDD=0 V state) FIG. 17 is a diagram showing the resume standby mode transition in the VDD=0 V state. FIG. 17 differs from FIG. 13 in that, in FIG. 17, the output terminal (output potential)

of the first regulator 25 changes from 1.18 V to 0.00 V while the switching control signal RSSW is 1.00 V. The rest of the configuration of FIG. 17 is the same as that of FIG. 13, and a description thereof will be omitted.

After the elapse of time thvdd_f after the transition of the resume standby signal RS from 1.00 V to 0.00 V, the output terminal (output potential) of the first regulator 25 becomes a state of 0.00 V. When the output terminal (output potential) of the first regulator 25 is changed from 0.00 V to 1.18 V, the switch control signal RSSW falls after the lapse of the time tsvdd_r.

Figure 18:
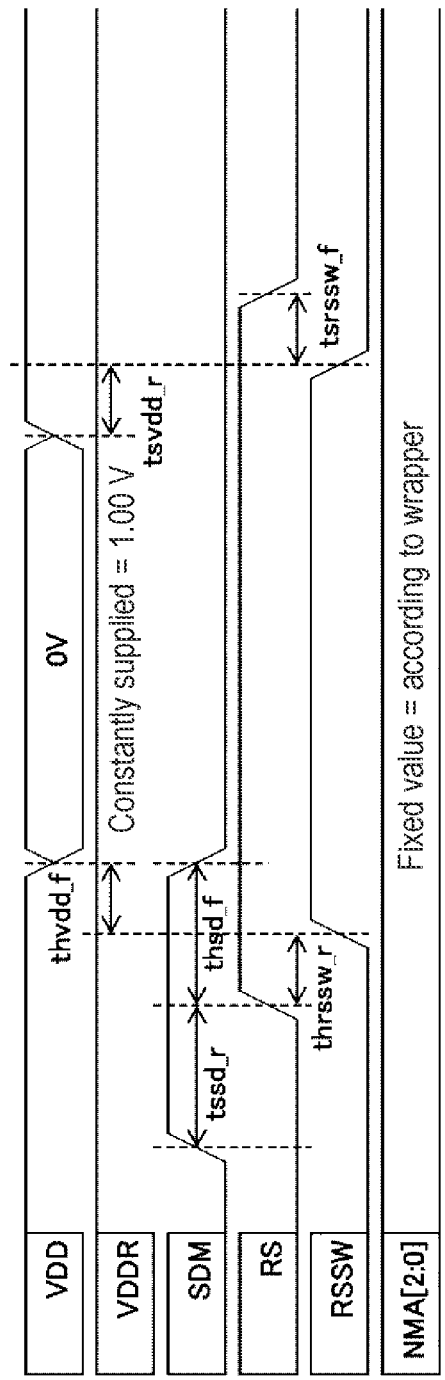
FIG. 18 is a diagram showing a shutdown mode transition in the VDD=0 V state.

(6. Transition of the shutdown mode in VDD=0 V state)
FIG. 18 is a diagram showing the transition of the shutdown mode in the VDD=0 V state. FIG. 18 differs from FIG. 14 in that, in FIG. 18, the output terminal (output potential) of the first regulator 25 changes from 1.18 V to 0.00V while the switching control signal RSSW is 1.00 V. The rest of the configuration of FIG. 18 is the same as that of FIG. 14, and a description thereof will be omitted.

After a time thvdd-f after the switch control signal RSSW is transited from 0.00 V to 1.00 V, the output terminal of the first regulator 25 becomes 0.00 V. When the output terminal (output potential) of the first regulator 25 is changed from 0.00 V to 1.18 V, the switching control signal RSSW is lowered from 1.00 V to 0.00 V after the elapse of the time tsvdd_r.

The first embodiment employs the following configuration in a static random access memory (SRAM) having a power supply for memory cells (VDDR) and a power supply for peripheral circuits (VDD). A) The resume standby signal RS switches the power supplied to the memory cell MC (memory array 22) between the power supply for the peripheral circuit (VDD) and the power supply for the memory cell (VDDR) (switched by the power switch circuit 21). B) In resume standby, it has a control signal (RSSW, LCMSW, LCMRSW, LCMNRSW, LCMNSW) for switching the power supplied to the memory cell MC (memory array 22). C) The well potential of the N-type well (NW3) of the memory cell MC (memory array 22) is dynamically changed at the transition to resume standby mode and at the return from resume standby mode.

As a result, the following effects can be obtained in the embodiment.

1) Since the power supply level of the memory cell MC (memory array 22) is switched by the power switch circuit 21, the leakage current can be reduced without deteriorating the write (Write) characteristic and the read (Read) characteristic. Since the peripheral power supply (VDD) is supplied to the memory cell MC during the normal operation (Write/Read), the transistor characteristics of the memory cell MC are not deteriorated.

2) Since the power supply level of the memory cell MC (memory array 22) is switched by the power switch circuit 21, it is not necessary to dynamically change the output voltage of the regulator (dynamic potential control of the regulator is not required). Since switching of the power supply according to each mode is performed by SRAM, only the power supply VDD for the peripheral circuit used in normal operation and the regulator (25,26) capable of generating a constant level of the power supply VDDR for the memory cell for data retention need be connected to each power supply.

3) Because it is possible to switch the power switch circuit 21 in the resume standby mode and the normal operation mode, power control in each SRAM is not required. When a plurality of the SRAMs is provided in the semiconductor device, since it has a resume standby signal RS for each SRAM, it is easy to control for each SRAM.

4) Since the memory cell power supply (holding power supply) VDDR is supplied from the second regulator 26, it is possible to accurately reduce the leakage current of the memory array (22).

5) Since the memory cell power supply (holding power supply) VDDR is supplied from the second regulator 26, the accuracy or the potential levels is high, and the holding characteristics of the memory cell array 22 or the memory cell array MC can be stabilized.

6) The holding power supply regulator (second regulator 26) can be reduced. Since the power supply VDDR for the memory cell may be at a potential level at which data can be held, the power supply voltage can be set lower than that in the normal mode. Therefore, the current capacity required for the regulator 26 is reduced.

7) Even if the peripheral circuit power supply VDD is turned off, data can be held in the memory array 22. By switching the power supply to the memory cell MC by the power switch circuit 21, the data of the memory array 22 in the holding power supply (VDDR) can be held. Since the switch control signal generation circuit section 24 is constantly supplied with the second power supply potential (VDDR) of 1.00 V from the second regulator (VDDR REG) 26, the switch control signal generation circuits (40, 50) formed in the switch control signal generation circuit section 24 can constantly generate the control signal for controlling the operation of the power supply switch circuit 21.

8) Even when a plurality of SRAM are provided in one semiconductor device, since the N-type wells are independent for each SRAM, the potentials of the N-type wells NW3 of the memory cells MCs can be dynamically changed for each SRAM by the resume standby signals RSs. That is, at the time of layout arrangement of a plurality of SRAM on the surface of the semiconductor chip, since the N-type well is independent for each SRAM, it is not necessary to consider the well isolation of each SRAM.

Embodiment 2

Figure 19:
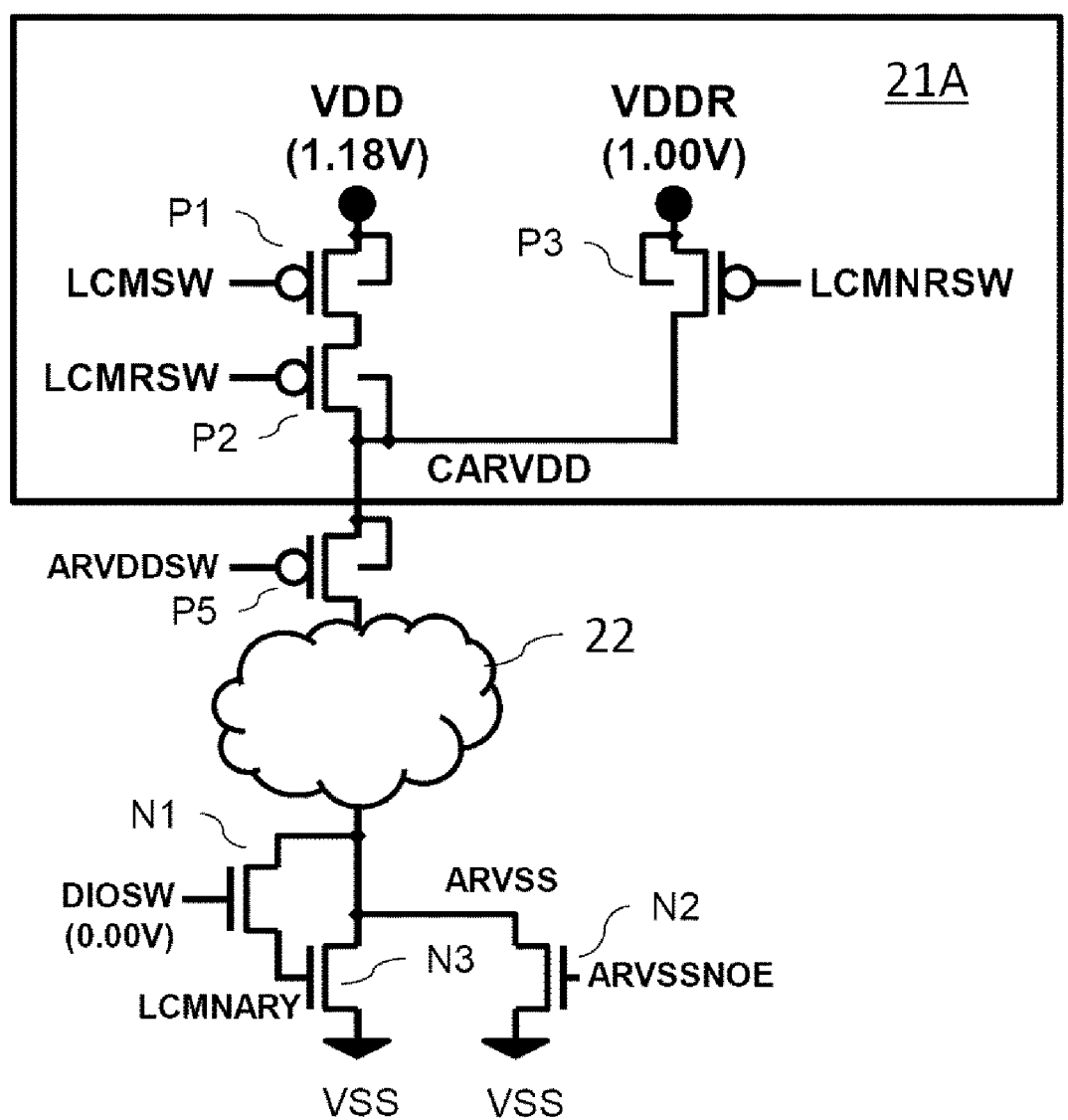
FIG. 19 is a diagram illustrating a configuration example of the power switch circuit according to a second embodiment.

FIG. 19 is a diagram illustrating a configuration example of the power switch circuit according to the second embodiment. The power switch circuit 21A shown in FIG. 19 differs from the power switch circuit 21 of FIG. 2, in the power switch circuit 21A, the fourth PMOS transistor P4 is deleted, and only the third PMOS transistor P3 is connected in series between the output terminal of the second regulator 26 and the source-drain path of the fifth PMOS transistor P5.

Also in the configuration of Example 2, the same effect as that of Example 1 can be obtained.

While the invention made by the present inventor has been specifically described above based on the Embodiment, the present invention is not limited to the above-described embodiment and Embodiment, and it is needless to say that the present invention can be variously modified.

What is claimed is:
1. A semiconductor device comprising:
   a first regulator configured to generate a first power supply voltage;
   a second regulator configured to generate a second power supply voltage lower than the first power supply voltage; and
   a random access memory having a normal operation mode and a resume standby mode,
   wherein the random access memory comprises:

a power supply switch circuit configured to receive the first power supply voltage and the second power supply voltage; and a memory array including a plurality of memory cells, wherein the power supply switch circuit supplies, at the normal operation mode, the first power supply voltage to the memory array, wherein the power supply switch circuit supplies, at the resume standby mode, the second power supply voltage to the memory array, wherein the power supply switch circuit includes a first PMOS transistor, a second PMOS transistor, a third PMOS transistor and a fourth PMOS transistor, wherein the first PMOS transistor includes:
a gate configured to receive a first switch control signal;
a source-drain path coupled to an output terminal of the first regulator; and
a back gate coupled to the output terminal of the first regulator, wherein the second PMOS transistor includes:
a gate configured to receive a second switch control signal;
a source-drain path coupled in serial to the source drain path of the first PMOS transistor, and further coupled to an internal power supply voltage of the memory array; and
a back gate coupled to an internal power supply voltage of the memory array, wherein the third PMOS transistor includes:
a gate configured to receive a third switch control signal;
a source-drain path coupled to an output terminal of the second regulator; and
a back gate coupled to the output terminal of the second regulator, and wherein the fourth PMOS transistor includes:
a gate configured to receive a fourth switch control signal;
a source-drain path coupled in serial to the source-drain path of the third PMOS transistor, and further coupled to the internal power supply voltage of the memory array; and
a back gate coupled to the internal power supply voltage of the memory array.

2. The semiconductor device according to claim 1, further comprising a switch control signal generation circuit configured to generate a switch control signal supplied to the power supply switch circuit,
wherein the power supply switch circuit supplies the first power supply voltage or the second power supply voltage based on the switch control signal.

3. The semiconductor device according to claim 1,
wherein each of the memory cells comprises an N-type well in which a P-channel load MOS transistor, and
wherein the N-type well is configured to be supplied the first power supply voltage at the normal operation mode, and be supplied the second power supply voltage at the resume standby mode.

4. The semiconductor device according to claim 1, further comprising a switch control signal generation circuit configured to generate the first to the fourth switch control signal based on the resume standby signal and the switch control signal, wherein the switch control signal generation circuit is configured to receive the first power supply voltage and the second power supply voltage,
wherein the first and the fourth switch control signal have the first power supply voltage or a ground voltage, and
wherein the second and the third control signal have the second power supply voltage or the ground voltage.

5. A semiconductor device comprising:
a first regulator configured to generate a first power supply voltage;
a second regulator configured to generate a second power supply voltage lower than the first power supply voltage; and
a random access memory having a normal operation mode and a resume standby mode,
wherein the random access memory comprises:
a power supply switch circuit configured to receive the first power supply voltage and the second power supply voltage; and
a memory array including a plurality of memory cells,
wherein the power supply switch circuit supplies, at the normal operation mode, the first power supply voltage to the memory array,
wherein the power supply switch circuit supplies, at the resume standby mode, the second power supply voltage to the memory array,
wherein the power supply switch circuit includes a first PMOS transistor, a second PMOS transistor, a third PMOS transistor and a fourth PMOS transistor,
wherein the first PMOS transistor includes:
a gate configured to receive a first switch control signal;
a source-drain path coupled to an output terminal of the first regulator; and
a back gate coupled to the output terminal of the first regulator,
wherein the second PMOS transistor includes:
a gate configured to receive a second switch control signal;
a source-drain path coupled in serial to the source drain path of the first PMOS transistor, and further coupled to an internal power supply voltage of the memory array; and
a back gate coupled to an internal power supply voltage of the memory array, and
wherein the third PMOS transistor includes:
a gate configured to receive a third switch control signal;
a source-drain path coupled to an output terminal of the second regulator, and further coupled to the internal power supply voltage of the memory array; and
a back gate coupled to the output terminal of the second regulator.

6. The semiconductor device according to claim 5, further comprising a switch control signal generation circuit configured to generate the first to the third switch control signal based on the resume standby signal and the switch control signal,
wherein the switch control signal generation circuit is configured to receive the first power supply voltage and the second power supply voltage,
wherein the first switch control signal has the first power supply voltage or a ground voltage, and
wherein the second and third switch control signal have the second power supply voltage or the ground voltage.

* * * * *